(12) United States Patent
van Veldhoven

(10) Patent No.: US 11,962,331 B2
(45) Date of Patent: Apr. 16, 2024

(54) SIGMA-DELTA ANALOG-TO-DIGITAL CONVERTER

(71) Applicant: NXP B.V., Eindhoven (NL)

(72) Inventor: Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 91 days.

(21) Appl. No.: 17/814,978

(22) Filed: Jul. 26, 2022

(65) Prior Publication Data

US 2023/0038361 A1 Feb. 9, 2023

(30) Foreign Application Priority Data

Aug. 6, 2021 (EP) ..................................... 21190192

(51) Int. Cl.
*H03M 3/00* (2006.01)
(52) U.S. Cl.
CPC ............ *H03M 3/434* (2013.01); *H03M 3/456* (2013.01); *H03M 3/49* (2013.01)
(58) Field of Classification Search
CPC ........ H03M 3/434; H03M 3/456; H03M 3/49; H03M 3/464; H03M 3/494
See application file for complete search history.

(56) References Cited

U.S. PATENT DOCUMENTS

| 8,736,473 | B2 | 5/2014 | Dijkmans et al. | |
| 11,502,698 | B1 * | 11/2022 | van Veldhoven | ..... H03M 3/414 |
| 2004/0017224 | A1 * | 1/2004 | Tumer | ..................... H03F 3/087 327/51 |
| 2005/0116850 | A1 * | 6/2005 | Hezar | ................... H03M 3/322 341/143 |
| 2005/0162222 | A1 * | 7/2005 | Hezar | ..................... H03F 3/217 330/10 |
| 2011/0050471 | A1 * | 3/2011 | Kumar | .................. H03M 3/368 341/143 |
| 2012/0038500 | A1 | 2/2012 | Dijkmans et al. | |
| 2015/0145485 | A1 * | 5/2015 | Xie | ..................... H02M 1/4208 323/210 |

(Continued)

OTHER PUBLICATIONS

De Melo, et al.: "Continuous-Time Delta-Sigma Modulators Based on Passive RC Integrators," IEEE Transactions on Circuits and Systems I: Regular Papers ( vol. 65, Issue: 11, Nov. 2018), DOI: 10.1109/TCSI.2018.2855649, pp. 3662-3674.

(Continued)

*Primary Examiner* — Lam T Mai

(57) ABSTRACT

A sigma-delta ADC is described including a passive filter with an input coupled to the ADC input and a filter output. A gain stage has an input connected to the filter output. A quantiser has an input connected to the gain stage output and a quantiser output. The passive filter includes a first filter resistor between the filter input and the filter output and a filter capacitor having first terminal coupled to the filter output. A feedback resistor is coupled between the quantiser output and the filter output and receives a negative of the value of the output to provide negative feedback to the filter output. The gain stage has a capacitor and resistor in series, and a gain element connected to the gain stage input and an output connected to the gain stage output. One terminal of the gain stage capacitor is connected to the gain element output.

20 Claims, 4 Drawing Sheets

(56) References Cited

U.S. PATENT DOCUMENTS

2018/0034427 A1* 2/2018 Mostert ................. H03F 3/2175
2019/0379455 A1* 12/2019 Wang ............... H04B 10/25753
2022/0416809 A1* 12/2022 Zhang ..................... H03M 3/34

OTHER PUBLICATIONS

Mukherjee et al.: "Design Tradeoffs for a CT-ΔΣ ADC With Hybrid Active-Passive Filter and FIR DAC in 40-nm CMOS," IEEE Solid-State Circuits Letters ( vol. 3), DOI: 10.1109/LSSC.2020.3010985, Publication: Jul. 21, 2020, pp. 214-217.
U.S. Appl. No. 17/398,391, van Veldhoven, Robert: "Dual Loop Passive Sigma-Delta Modulator", filed Aug. 10, 2021.
Zhang et al.: "Power-Efficient Gm-C DSMs With High Immunity to Aliasing, Clock Jitter, and ISI," IEEE Transactions on Very Large Scale Integration (VLSI) Systems, vol. 27, Issue: 2, Feb. 2019, DOI: 10.1109/TVLSI.2018.2874259, pp. 337-349.

\* cited by examiner

100

150

200

600

650

SIGMA-DELTA ANALOG-TO-DIGITAL CONVERTER

CROSS-REFERENCE TO RELATED APPLICATIONS

This application claims the priority under 35 U.S.C. § 119 of European Patent application no. 21190192.1, filed on 6 Aug. 2021, the contents of which are incorporated by reference herein.

FIELD

This disclosure relates to sigma delta analog to digital (ADC) converters.

BACKGROUND

Sigma-delta analog to digital converters, also referred to as Delta-Sigma analog to digital converters, are widely used in audio applications such as smart amplifier, digital and analog microphones, power integrated circuits and instrumentation. In some implementations, the quantiser in the sigma-delta ADC is implemented as a comparator. The comparator may need to be fast, in order to enable a high bandwidth, and accurate by minimizing errors due to 1/f noise and offset, which leads to bulky devices. The bulky devices may therefore slow down the comparator.

SUMMARY

Various aspects of the disclosure are defined in the accompanying claims. In a first aspect there is provided a sigma-delta analog to digital converter (ADC) comprising: an input; an output; a passive filter having a filter output, and a filter input coupled to the input; a gain stage having a gain stage input coupled to the filter output and a gain stage output; a quantiser having a quantiser input coupled to the gain stage output and a quantiser output coupled to the output; a feedback resistor having a feedback resistor first terminal coupled to the filter output and a feedback resistor second terminal configured to receive a negative of a value of the output; wherein the passive filter comprises a first filter resistor coupled between the filter input and the filter output, and a filter capacitor having a filter capacitor first terminal coupled to the filter output and a filter capacitor second terminal; and the gain stage comprises a gain element having a gain element input coupled to the gain stage input and a gain element output coupled to the gain stage output; a first gain stage capacitor having a first gain stage capacitor first terminal coupled to the gain element output; and a first gain stage resistor having a first gain stage resistor first terminal coupled to a first gain stage capacitor second terminal and a first gain stage resistor second terminal and wherein the gain element comprises one of a transconductance amplifier and a series arrangement of an operational amplifier and a second gain stage resistor.

In one or more embodiments, the gain stage may further comprise: a chopper circuit having a chopper circuit first input coupled to the passive filter output, a chopper circuit second input coupled to ground, a chopper circuit first output coupled to the gain element input, and a chopper circuit second output coupled to a gain element further input; and a de-chopper circuit having a de-chopper circuit first input coupled to the gain element output, a de-chopper circuit second input coupled to a gain element further output, a de-chopper circuit first output coupled to the quantiser input, and a second de-chopper output coupled to a quantiser further input.

In one or more embodiments, the sigma-delta ADC may comprise an inverting circuit for providing the negative of a value of the output, the inverting circuit having an inverting circuit input coupled to the output and an inverting circuit output coupled to the feedback resistor first terminal.

In one or more embodiments, the quantiser may comprise a clocked comparator.

In one or more embodiments, the sigma-delta ADC may comprise a counter having a counter input coupled to the quantiser output and a counter output and wherein the counter is configured to vary the counter output dependent on the quantiser output value.

In one or more embodiments, the sigma-delta ADC may comprise: one or more further feedback resistors in parallel with the feedback resistor, each of the feedback resistor and one or more further feedback resistors having a first terminal coupled to the passive filter output; and a plurality of switches arranged in parallel and configured to switchably couple one of a first voltage and a second voltage to a respective one of the feedback resistor second terminal and the one or more further feedback resistor second terminals dependent on the counter output.

In one or more embodiments, the sigma-delta ADC may comprise a dynamic element matching circuit arranged between the counter output and the plurality of switches and configured to control the plurality of switches dependent on the counter output value.

In one or more embodiments, the passive filter may further comprise a second filter resistor having a second filter resistor first terminal coupled to the filter capacitor second terminal and a second filter resistor second terminal coupled to ground and wherein the first gain stage resistor second terminal is coupled to ground.

In one or more embodiments, the filter capacitor second terminal and the first gain stage resistor second terminal may be coupled to ground.

In one or more embodiments, the sigma-delta ADC may further comprise: a further input; a further output; wherein the passive filter has a filter further input coupled to the further input and a filter further output coupled to the filter capacitor second terminal; the gain stage has gain stage further output, and a gain stage further input coupled to the filter further output; the quantiser has a further quantiser input coupled to the gain stage further output and a quantiser further output coupled to the further output; wherein the passive filter comprises a second filter resistor having a second filter resistor first terminal coupled to the filter further input and a second filter resistor second terminal coupled to the filter further output; the gain element has a gain element further input coupled to the gain stage further input and a gain element further output coupled to the gain stage further output and a second gain stage capacitor coupled between the gain element further output and the first gain stage resistor second terminal; and the sigma-delta ADC further comprises a further feedback resistor having a further feedback resistor first terminal coupled to the output and a further feedback resistor first terminal coupled to the passive filter further output; and wherein the feedback resistor first terminal is coupled to the further output and the feedback resistor second terminal is coupled to the passive filter output.

In one or more embodiments, the gain stage may further comprise: a chopper circuit having a chopper circuit first input coupled to the passive filter output, a chopper circuit second input coupled to the filter further output, a chopper circuit output coupled to the gain element input, and a chopper circuit second output coupled to the gain element further input; and a de-chopper circuit having a de-chopper first input coupled to the gain element output, a de-chopper second input coupled to the gain element further output, a de-chopper first output coupled to the gain stage output, and a de-chopper second output coupled to the gain stage further output.

In one or more embodiments, the quantiser may comprise a clocked comparator.

In one or more embodiments, the sigma-delta analog to digital converter may further comprise a counter having a counter input coupled to the quantiser output and a counter output and configured to vary the counter output dependent on the quantiser output value; and a further counter having a further counter input coupled to the quantiser further output and a further counter output and configured to vary the further counter output dependent on the further quantiser output.

In one or more embodiments, the sigma-delta ADC may further comprise one or more first further feedback resistors arranged in parallel with the feedback resistor, each of the feedback resistor and one or more first further feedback resistors having a first terminal coupled to the filter output; and a plurality of switches configured to switchably couple one of a first voltage and a second voltage to a respective second terminal of the feedback resistor and the one or more first further feedback resistors dependent on the counter output value; and one or more second further feedback resistors arranged in parallel with the further feedback resistor, each of the further feedback resistor and the one or more second further feedback resistors having a first terminal coupled to the filter further output; and a further plurality of switches configured to switchably couple one of the first voltage and the second voltage to a respective second terminal of the further feedback resistor and the one or more second further feedback resistors dependent on the counter output value.

In one or more embodiments, the sigma-delta ADC may further comprise a dynamic element matching circuit arranged between the counter output and the plurality of switches and configured to control the plurality of switches dependent on the counter output value.

In one or more embodiments, the passive filter may further comprise a second filter resistor having a second filter resistor first terminal connected to the filter capacitor second terminal and a second filter resistor second terminal connected to the filter further output.

In a second aspect there is provided a differential sigma-delta ADC comprising a negative signal input and a positive signal input; a negative signal output and a positive signal output; a passive filter having a pair of filter inputs and a pair of filter outputs, each filter input coupled to a respective one of the negative signal input and the positive signal input; a gain stage having a pair of gain stage inputs and a pair of gain stage outputs, the pair of gain stage inputs being coupled to a respective one of the pair of filter outputs; a quantiser having a pair of quantiser inputs coupled to a respective one of the pair of gain stage outputs and a pair of quantiser outputs coupled to a respective one of the negative signal output and the positive signal output; wherein the passive filter comprises a filter resistor coupled between each respective filter input and filter output and a filter capacitor coupled between the pair of filter outputs; the sigma-delta ADC further comprises: a first feedback resistor coupled between the negative signal output and the filter output corresponding to the positive signal input; and a second feedback resistor coupled between the positive signal output and the filter output corresponding to the negative signal input; and the gain stage comprises a gain element having a pair of gain element inputs coupled to the pair of gain stage inputs and a pair of gain element outputs coupled to the pair of gain stage outputs and a series arrangement of a first gain stage capacitor, a first gain stage resistor, and a second gain stage capacitor coupled between the pair of gain element outputs.

In one or more embodiments, the gain stage may further comprise: a chopper circuit having a pair of chopper inputs, each chopper input coupled to a respective one of the pair of gain stage inputs and a pair of chopper outputs each chopper output coupled to a respective one of the pair of gain element inputs; and a de-chopper circuit having a pair of de-chopper inputs, each de-chopper input coupled to a respective one of the pair of gain element outputs, and a pair of de-chopper outputs, each de-chopper output coupled to a respective one of the pair of gain stage outputs.

In one or more embodiments, the differential ADC may further comprise: a first digital integrator having a first digital integrator input coupled to the negative signal output and a first digital integrator output; and a second digital integrator having a first digital integrator input coupled to the positive signal output and a first digital integrator output.

In one or more embodiments, the differential ADC may further comprise: one or more of first further feedback resistors in parallel with the first feedback resistor, each of the first feedback resistor and the one or more first further feedback resistors having a first terminal coupled to the filter output corresponding to the positive signal input; and a parallel arrangement of a plurality of switches, each switch configured to switchably couple one of a first voltage and a second voltage to a respective second terminal of the feedback resistor and the one or more first further feedback resistors dependent on a value of the first digital integrator output; and one or more second further feedback resistors in parallel with the second feedback resistor, each of the further feedback resistor and the one or more second further feedback resistors having a first terminal coupled to the filter output corresponding to the negative signal input; and a plurality of switches, each switch configured to switchably couple one of the first voltage and the second voltage to a respective second terminal of the further feedback resistor and the one or more second further feedback resistors dependent on a value of the second digital integrator output.

BRIEF DESCRIPTION OF THE DRAWINGS

In the figures and description like reference numerals refer to like features. Embodiments are now described in detail, by way of example only, illustrated by the accompanying drawings in which.

DETAILED DESCRIPTION OF EMBODIMENTS

Figure 1:
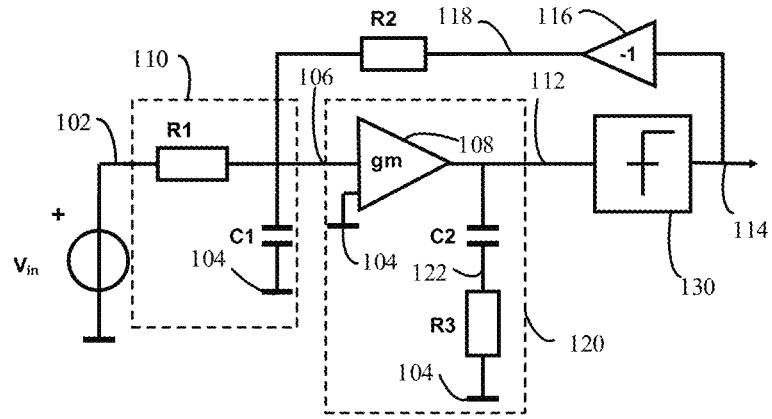
FIG. 1 shows a sigma-delta analog to digital converter according to an embodiment.

FIG. 1 shows an example sigma delta analog to digital converter (ADC) 100. The sigma delta ADC 100 includes a passive filter 110, a gain stage 120, and a quantiser 130 which includes a clocked comparator. An input 102 is connected to the input of the passive filter 110. The passive filter 110 includes a filter resistor R1 having a first terminal connected to the ADC input 102 and a second terminal connected to the passive filter output 106. A filter capacitor C1 has a first terminal connected to the filter output 106 and a second terminal connected to a ground 104.

The gain stage 120 includes a gain element 108 which may be for example a gm gain element such as an operational transconductance amplifier (OTA). The gain element 108 may have a first input connected to the passive filter output 106 and a second input connected to a ground 104. In other examples, a different voltage reference than ground may be used. An output of the gain element 108 is connected to the gain stage output 112. The gain stage 120 has a gain stage capacitor C2 which may also be referred to as an integration capacitor. The gain stage capacitor C2 has a first terminal connected to the gain stage output 112 and a second terminal connected to node 122. The gain stage 120 also has a gain stage resistor R3 having a first terminal connected to node 122 and a second terminal connected to ground 104. The gain stage resistor R3 may also be referred to as a "zero" resistor and may ensure the loop is first order at high frequencies for loop stability.

The gain stage output 112 is connected to an input of the quantiser 130. A quantiser output 114 may be connected to an input of an inverting circuit 116. In other examples, the quantiser 130 may directly provide an inverted quantiser output. In some examples the inverter output may in addition to inverting the signal generate a return-to-zero signal output. An output 118 of the inverting circuit 116 may be connected to a first terminal of a feedback resistor R2. A second terminal of the feedback resistor R2 may be connected to the passive filter output 106. The combination of the inverting circuit 116 and resistor R2 may be considered to implement a 1-bit digital-to-analog converter (DAC). The quantiser output 114 may be connected to further circuitry such as a decimation filter and further digital circuitry known to the skilled person to implement a digital output of the ADC from the quantiser output 114.

In operation, an input signal received at the ADC input 102 is filtered by the passive filter 110. The gain stage 120 acts to integrate the signal received from the filter output 106 and provides an input signal to the quantiser 130 which may compare the signal with a fixed reference (not shown) and output a series of positive (+1) pulses and negative pulses (−1) depending on the comparison. The inverse of the output pulse value is fed back via feedback resistor R2 to the filter output. In this example the quantiser typically has a positive voltage supply and negative voltage supply (not shown) to generate the +1 and −1 pulses. In other examples, only a positive supply and ground may be available. In these examples, the inverting circuit 116 may be replaced by a logical inverter. In other examples, the inverting circuit 116 may also include a return-to-zero (RTZ) circuit to mitigate inter symbol interference between the output pulses.

The inventor of the present disclosure has appreciated that having a passive filter 110 at the first stage may allow a much simpler feedback circuitry than other sigma-delta ADCs which for example may have multiple feedback loops and finite-impulse-response (FIR) filters to stabilize the ADC. Furthermore, adding the gain stage 120 which may also be referred to as a gm-C stage in the loop may improve the performance in multiple ways. Firstly, the noise and offset of the comparator in the quantiser 130 may be rejected by the gm-C stage, enabling a more independent optimization for the gain stage 120 and comparator in the quantiser 130. The comparator can be optimized for speed, and the gm-C stage can be optimized for accuracy (noise and offset). In addition, the loop gain of the sigma-delta ADC 100 may not depend solely on the gain of the comparator in the quantiser 130, since the gain stage 120 may also provide some gain to enable noise shaping of the quantization noise. The sigma-delta ADC 100 may have improved performance with a much simpler implementation than other sigma-delta ADCs. Furthermore, smaller transistors may be used to implement the comparator in the quantiser to optimize the comparator for speed which may result in a smaller implementation area.

Figure 2:
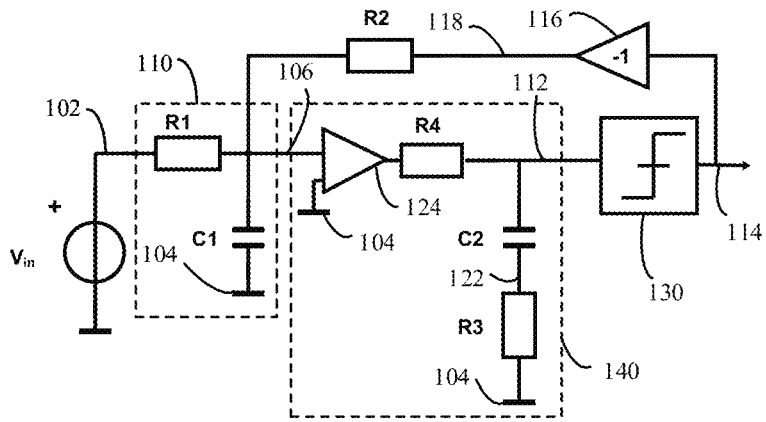
FIG. 2 illustrates a sigma-delta analog to digital converter according to an embodiment.

FIG. 2 shows an example sigma delta ADC 150. The gain stage 120 in the sigma delta ADC 100 is replaced by the gain stage 140. In gain stage 140 the gain element 108 is implemented by an operational amplifier 124 having a first input connected to the filter output 106, a second input connected to a ground 104 and a second gain stage resistor R4 having a first terminal connected to the output of the operational amplifier 124 and a second terminal connected to the gain stage output 112. Because the operational amplifier 124 has a low output impedance, and additional resistor R4 makes the filter pole R4/C2. In sigma-delta ADC 100, the filter pole was made by the value of gm and C2. The other elements in sigma delta ADC 150 are the same as previously described for the sigma delta ADC 100.

Figure 3:
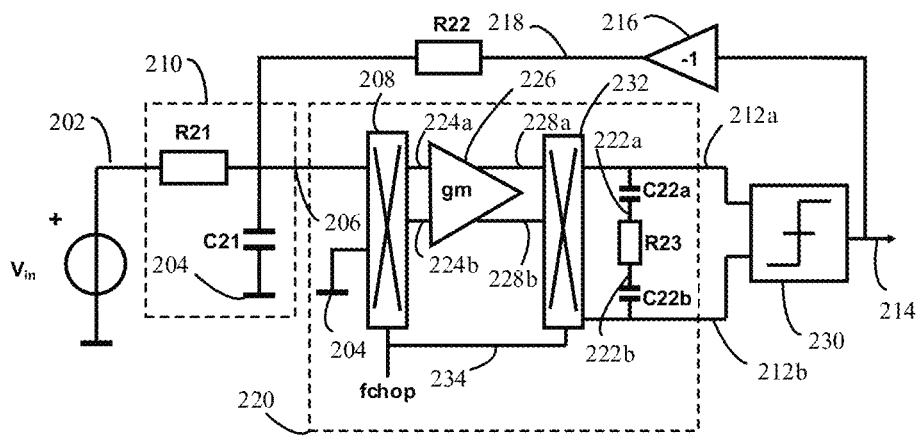
FIG. 3 shows a sigma-delta analog to digital converter according to an embodiment.

FIG. 3 shows an example sigma delta ADC 200. The sigma delta ADC 200 includes a passive filter 210, a gain stage 220, and a quantiser 230 which includes a clocked comparator. An input 202 is connected to the input of the passive filter 210. The passive filter 210 includes a filter resistor R21 having a first terminal connected to the ADC input 202 and a second terminal connected to the passive filter output 206. A filter capacitor C21 has a first terminal connected to the filter output 206 and a second terminal connected to a ground 204.

The gain stage 220 includes a chopper 208 having a first chopper input connected to the filter output 206 and a second chopper input connected to ground 204. A gain element 226 which may be for example a gm gain element such as an operational transconductance amplifier (OTA) has a first input connected to a first chopper output 224a and a second input connected to a second chopper output 224b. The gain element 220 may have a first output 228a connected to a first input of the de-chopper 232 and a second output 228b connected to a second input of the de-chopper 232. The de-chopper first output is connected to a first gain stage output 212a. The de-chopper second output is connected to a second gain stage output 212b. The gain stage 220 has a first gain stage capacitor C22a which may also be referred to as an integration capacitor. The first gain stage capacitor C22a has a first terminal connected to the gain stage output 212a and a second terminal connected to node 222a. The gain stage 220 also has a gain stage resistor R23 having a first terminal connected to node 222a and a second terminal connected to node 222b. A second gain stage capacitor 222b has a first terminal connected to node 222b and a second terminal connected to the second gain stage output 212b. The chopper 208 and de-chopper 232 may each have an input connected to a chopper clock input 234.

The first gain stage output 212a is connected to a first input of the quantiser 230. The second gain stage output 212b is connected to a second input of the quantiser 230. The quantiser output 214 may be connected to an input of an inverting circuit 216. In other examples, the quantiser 230 may directly provide an inverted quantiser output. The output 218 of the inverting circuit 216 may be connected to a first terminal of a feedback resistor R22. A second terminal of the feedback resistor R22 may be connected to the passive filter output 206. The quantiser output 214 may be connected to further circuitry such as a decimation filter and further digital circuitry known to the skilled person to implement a digital output of the sigma delta ADC 200 from the quantiser output 214.

The sigma-delta ADC 200 may improve accuracy of the gain stage 220 by chopping using chopper circuit 208 and de-chopping circuit 232 to remove offset and 1/f noise. The implementation of chopper circuit 208 and de-chopper circuit 232 may use typical chopping circuits. The gain stage 220 receives a single-ended input and is then implemented as a differential circuit. The gain stage 220 provides a differential output to the quantiser 230. The quantiser 230 may then output a value dependent on whether the voltage at the first gain stage output 212a is greater than the voltage at the second gain stage output 212b or vice versa. In other respects, the operation of sigma-delta ADC 200 is similar to that described for sigma-delta ADC 100.

The inventor of the present disclosure has further appreciated that because the first filter stage is passive, the input signal to the gain stage 220 is very small. This may result in the linearity requirements on the gain stage 220 being relaxed. In addition, because the input signal is small, the chopping will not lead to additional non-linearity due to parasitic effects during the switching of the chopping, and may significantly reduce high-frequency quantization noise folding back to the signal bandwidth due to chopping. Furthermore, because the input signal is very low at the input of the gain stage 220 which may for example be a few millivolts, very high chopping frequencies (fchop) can be used for example up to the sampling frequency of the quantiser which may for example by 32 MHz. These high chopping frequencies may be used and the linearity of the sigma delta ADC 200 may not decrease. This may allow the implementation of a sigma delta ADC using high bandwidth chopped sigma delta modulators.

Figure 4:
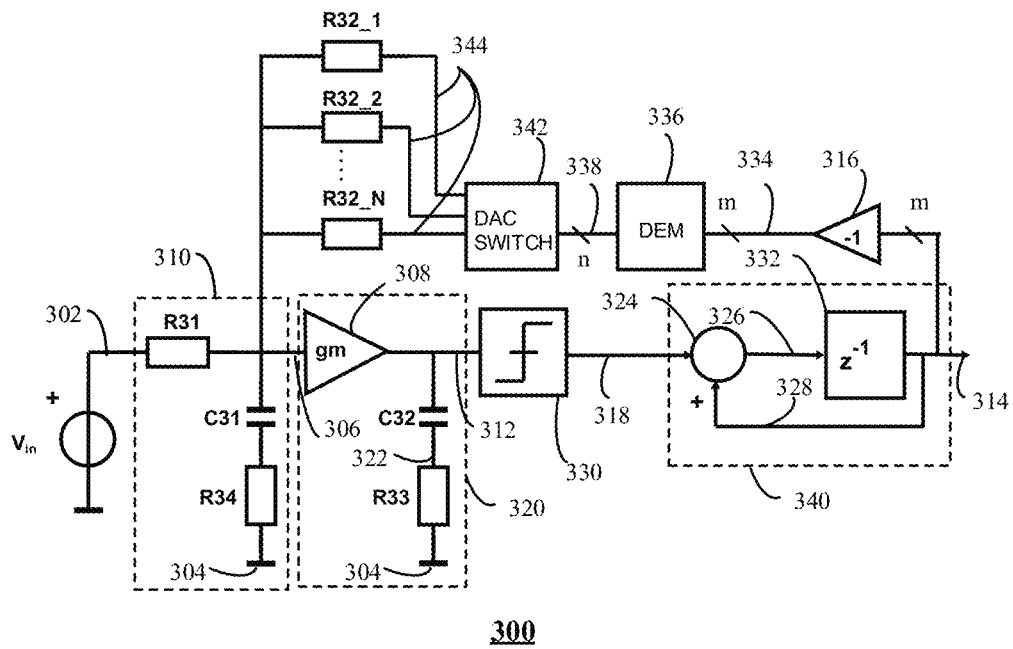
FIG. 4 shows a sigma-delta analog to digital converter according to an embodiment.

FIG. 4 shows an example sigma delta analog to digital converter (ADC) 300. The sigma delta ADC 300 includes a passive filter 310, a gain stage 320, a quantiser 330 which includes a clocked comparator, a counter 340 which may also be considered as a digital integrator, a dynamic element matching circuit (DEM) 336, and digital to analog converter (DAC) switches 342. An input 302 is connected to the input of the passive filter 310. The passive filter 310 includes a first filter resistor R31 having a first terminal connected to the ADC input 302 and a second terminal connected to the passive filter output 306. A filter capacitor C31 has a first terminal connected to the filter output 306 and a second terminal connected to a first terminal of a second filter resistor R34. A second terminal of the second filter resistor R34 is connected to ground 304.

The gain stage 320 includes a gain element 308 which may be for example a gm gain element such as an operational transconductance amplifier (OTA). The gain element 308 has a first input connected to the passive filter output 306 and an output connected to the gain stage output 312. A second input of gain element 308 (not shown) may be connected to a reference voltage or ground. The gain stage 320 has a gain stage capacitor C32 which may also be referred to as an integration capacitor. The gain stage capacitor C32 has a first terminal connected to the gain stage output 312 and a second terminal connected to node 322. The gain stage 320 also has a gain stage resistor R33 having a first terminal connected to node 322 and a second terminal connected to ground 304.

The gain stage output 312 is connected to a first input of the quantiser 330. A second input of the quantiser 330 (not shown) may be connected to a reference voltage. In some examples, if the gain stage 320 and the quantiser 330 have a positive supply and a negative supply, the reference voltage may be ground. In other examples, if the gain stage 320 and the quantiser 330 have a single supply and ground, the reference voltage may be half of the supply voltage. The quantiser output 318 may be connected to an input of an up/down counter 340. The up/down counter 340 may be configured to count up or increment the count when a positive pulse is output from the quantiser 330 and decrement or decrease the count value when a negative pulse is output from the quantiser 330. The counter 340 as illustrated is shown as implemented with an adder 324 and a delay element 332. A first adder input is connected to the quantiser output 318. The output 328 of the delay module 332 is connected to a first input of the adder 324. The adder output 326 is connected to the input of the delay module 332. It will be appreciated that in other examples, the up/down counter may be implemented in other ways to that illustrated. The counter output 314 may be connected to further circuitry such as a decimation filter and further digital circuitry known to the skilled person to implement a digital ADC output from the counter output 314.

The m-bit counter output 314 may be connected to an input of inverting circuit 316. In other examples, the counter 340 may directly provide an inverted output. The output 334 of the inverting circuit 316 may be connected to an input of dynamic element matching circuit 336. The dynamic element matching circuit will have $2^m$ outputs 338 connected to the input of the DAC switches 342. The DAC outputs 344 are connected to a respective first terminal of a parallel arrangement of n resistors R32_1, R32_2, R32_N. If the counter 340 produces a parallel output of m-bits, then the number of resistors n is $2^m$.

A second terminal of each of the feedback resistors R32_1, R32_2, R32_N is connected to the passive filter output 306. Adding counter 340 in the loop makes the output 314 of the sigma delta ADC a multi-bit out. The counter 340 may act as a digital integrator, this causes an additional pole in the control loop. Therefore, to avoid an unstable loop, a second zero may be added in the passive filter 310 by the addition of second filter resistor R34. Also, because the output is now multi-bit more than one feedback resistor R32_1 may be used. For example, when the sigma-delta ADC 300 is designed such that the output word is 5 bit, 2^5=32 resistors. These resistors on one side are connected to the virtual ground node the filter output 306, and on the other side are switched either to ground or the reference voltage depending on the digital output code. The combination of the DEM 336, DAC switches 342 and feedback resistors R32_1, R32_2, R32_N act as a DAC to convert the counter output into an analog signal which is fed back in a negative feedback loop to the filter output 306. In some examples, the DEM 336, and DAC switches 342 may implement a return-to-zero output function to mitigate inter symbol interference between the output pulses.

Figure 5:
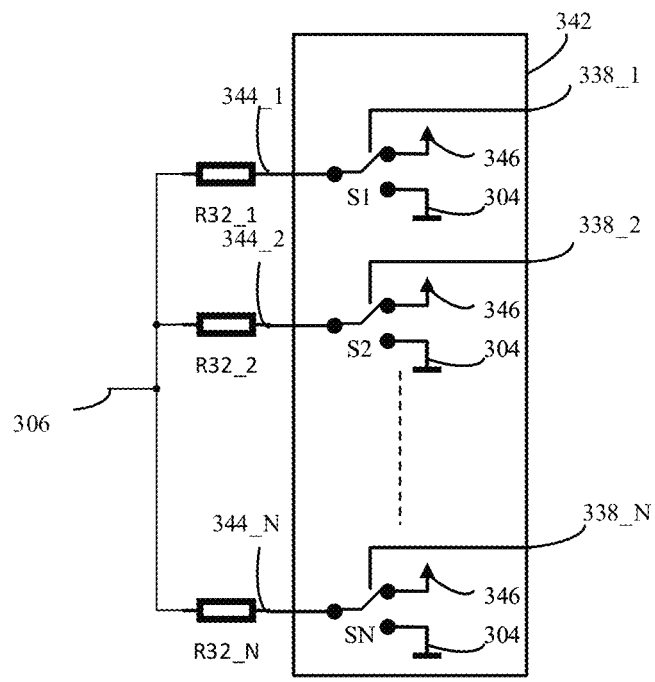
FIG. 5 shows an example implementation of a digital-to-analog converter for the sigma-delta ADC of FIG. 4.

FIG. 5 shows a further detail of an example implementation of the DAC switches 342 having of N switches S1, S2, ... SN arranged in parallel. The N switches may each have a first terminal connected to a respective DAC output 344_1, 344_2, 344_N and to a respective first terminal of one of the resistors R32_1, R32_2, R32_N which may have the same resistance value. A respective control output 338_1, 338_2, ... 338_N from the dynamic element matching circuit 336 controls respective switch S1, S2, ... SN to switch between a reference voltage (Vref) 346 and a second supply voltage, which may be ground 304, depending on the counter output value. The DEM 336 may select different groups of resistors each time a particular counter value is output using techniques familiar to the skilled person, for example using barrel shifting or data weighted averaging to minimise errors due to manufacturing tolerance variations in the resistance values.

Adding a counter 340 to the loop may reduce quantization noise, and thereby Signal-to-Quantization-Noise (SQNR) may be improved.

The (high frequency) quantization noise at the output of the sigma delta converter may be lower compared with that of a 1-bit sigma delta, which may mean that the decimation filter requirements are lower since there is less noise to filter. Consequently, reduced complexity decimation filters with less suppression may be used.

The error signal at the passive filter output 306 is smaller because of the smaller least-significant-bit (LSB) size for the multi-bit DAC in the feedback compared with, for example, that of sigma-delta ADC 100 which effectively is a single-bit DAC in the feedback path. This may further reduce the linearity requirements for the gain stage 320. As there is less quantization noise at the input of the gain stage 320, the risk of quantization noise folding due to chopping may be further reduced.

Furthermore since sigma-delta ADC 300 uses a high clock frequency, the DEM 336 for the DAC switches 342 may use a relatively simple method, such as for example barrel-shifting or Data Weighted Averaging, even for a relatively large mismatch of resistance values due to process variation.

Figure 6:
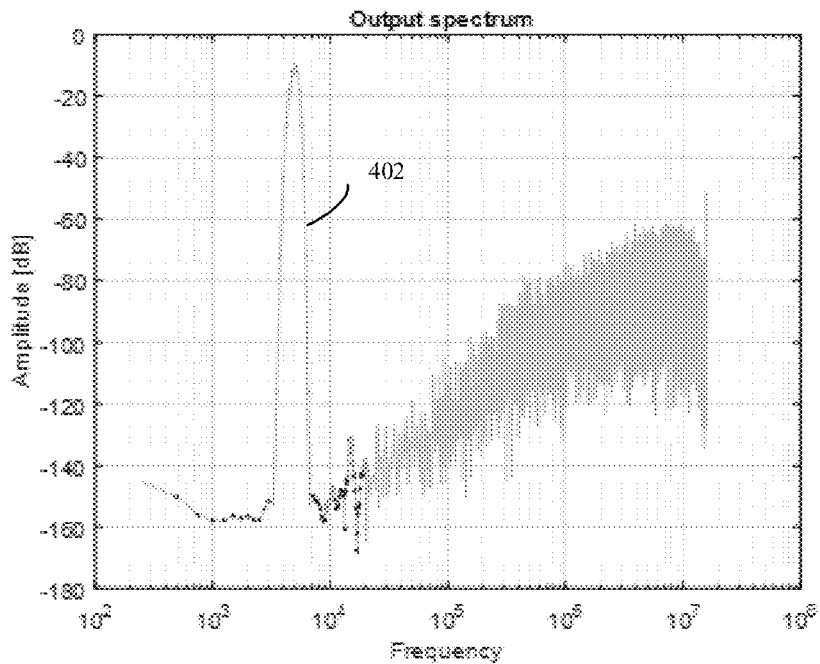
FIG. 6 shows an example output spectrum for the sigma-delta ADC of FIG. 4.

FIG. 6 shows a graph of the output spectrum of an example implementation the sigma delta ADC 400 for audio applications. The y-axis shows a scale of the amplitude in dB ranging from −180 dB to 0 dB and the x-axis in a logarithmic scale of the frequency bandwidth ranging from 100 Hz to 100 MHz. The peak 402 indicates that for a 20 kHz bandwidth the signal-to-noise ratio is 124 dB.

Figure 7:
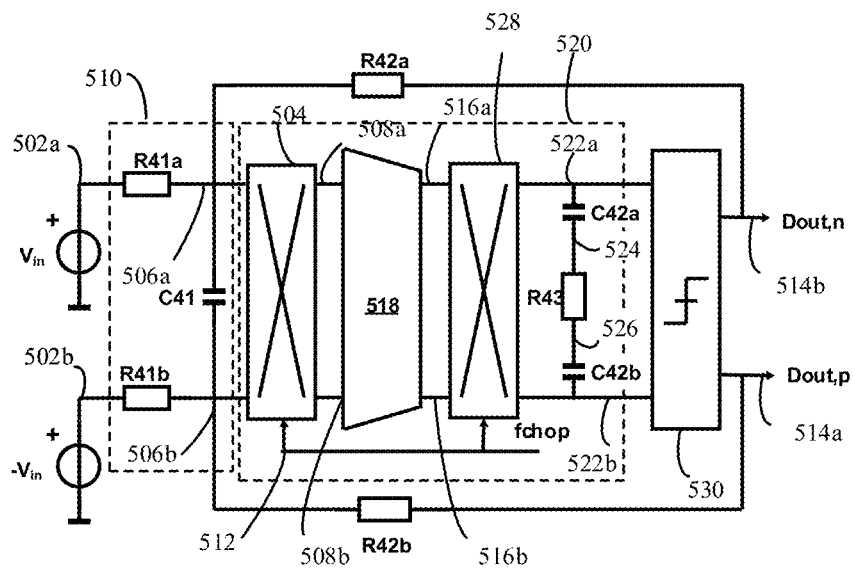
FIG. 7 shows a sigma-delta analog to digital converter according to an embodiment.

FIG. 7 shows an example differential sigma delta ADC 500. The sigma delta ADC 500 includes a passive filter 510, a gain stage 520, and a quantiser 530 which includes a clocked comparator. A first input 502a which may be considered as the positive signal input is connected to a first input of the passive filter 510. A second input 502b which may be considered as the negative signal input is connected to a second input of the passive filter 510. The passive filter 510 includes a first filter resistor R41a having a first terminal connected to the first input 502a and a second terminal connected to a first passive filter output 506a. The passive filter 510 includes a second filter resistor R41b having a first terminal connected to the second input 502b and a second terminal connected to a second passive filter output 506b. A filter capacitor C41 has a first terminal connected to the first filter output 506a and a second terminal connected to the second filter output 506b.

The gain stage 520 includes a chopper 504 having a first chopper input connected to the first filter output 506a and a second chopper input connected to the second filter output 506b. A gain element 518 which may be for example a gm gain element such as an operational transconductance amplifier (OTA) has a first (positive) input connected to the first chopper output 508a and a second (negative) input connected to the second chopper output 508b. A first gain element output 516a is connected to a first input of a de-chopper 528. A second gain element output 516b is connected to a second input of the de-chopper 528. The first de-chopper output is connected to the first gain stage output 522a. The second de-chopper output is connected to the second gain stage output 522b. The chopper 504 and de-chopper may have clock inputs connected to a chopper clock input 512.

The gain stage 520 has a first gain stage capacitor C42a which may also be referred to as an integration capacitor. The first gain stage capacitor C42a has a first terminal connected to the first gain stage output 522a and a second terminal connected to node 524. The gain stage 520 also has a gain stage resistor R43 having a first terminal connected to node 524 and a second terminal connected to node 526. A second gain stage capacitor C42b has a first terminal connected to the second gain stage output 522b and a second terminal connected to node 526.

The first gain stage output 522a is connected to a first input of the quantiser 530. The second gain stage output 522b is connected to a second input of the quantiser 530.

The negative output 514b of the quantiser may be connected to a first terminal of a feedback resistor R42a. A second terminal of the feedback resistor R42a may be connected to the first (positive) passive filter output 506a. The positive output 514a of the quantiser may be connected to a first terminal of a feedback resistor R42b. A second terminal of the feedback resistor R42b may be connected to the second (negative) passive filter output 506b. The differential quantiser outputs 514a, 514b may be connected to further circuitry such as a decimation filter and further digital circuitry known to the skilled person to implement a digital output of the sigma delta ADC 200 from the quantiser output values. The operation of sigma-delta ADC 500 is similar to that already previously described for sigma-delta ADC 100 and sigma-delta ADC 200.

In other examples of the differential sigma-delta ADC, the chopper 504 and the de-chopper 528 may be omitted resulting in a differential ADC corresponding to the single-ended sigma delta ADC 100. In other examples of the differential sigma-delta ADC, a counter, DEM, DAC and resistors may be added for each of the outputs 514a, 514b and feedback paths to implement a differential sigma delta ADC corresponding to the single-ended ADC 300. The values of the passive components may be chosen dependent on the frequency of the application. In an example audio application, the following values may be used for sigma-delta ADC 500. Sample frequency of the quantiser 32 MHz, R41a=50 KOhm, R41b=50 KOhm, R42a=50 KOhm, R42b=50 KOhm, R43=1.1 KOhm, C41=50 pF, C42a, C42b=21.5 pF, Gm=50e-6 S. In some examples capacitors C41 and C42a, C42b may be connected to ground. In particular, if C41 is connected to ground then the common mode rejection at high frequencies may be improved.

Figure 8A:
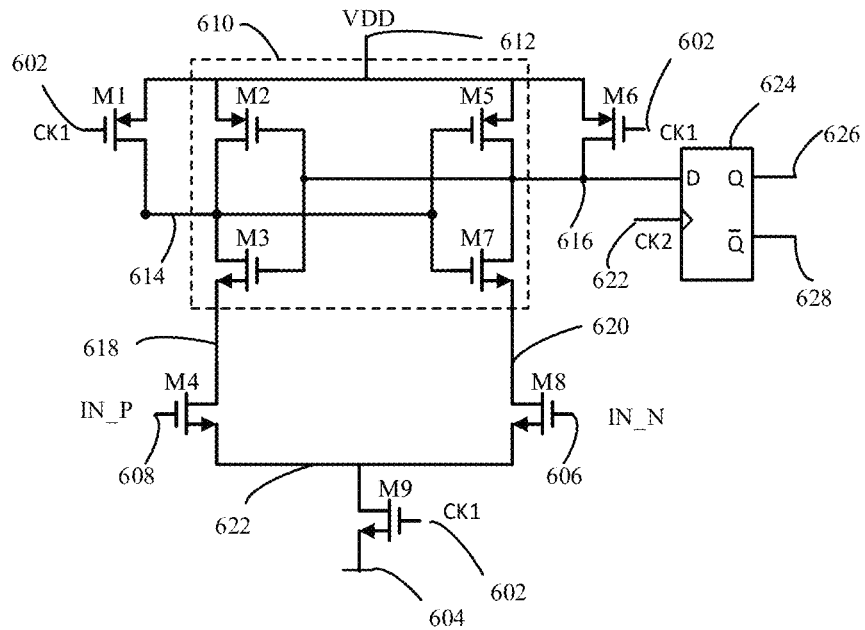
FIG. 8A shows an example implementation of a quantiser for a sigma-delta ADC.
Figure 8B:
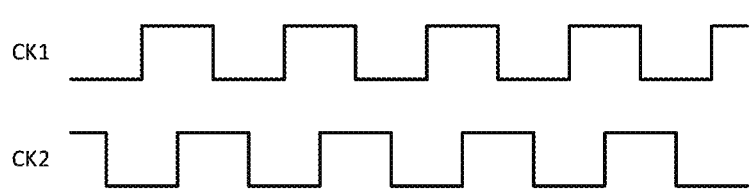
FIG. 8B shows an example clock waveform for the quantiser of FIG. 8A.

FIG. 8A shows a known example of a quantiser 600 including a clocked comparator which may be used in any of the quantisers 130, 230, 330, 530. It will be appreciated that other quantiser circuits known to the skilled person may also be used. Example clock waveforms 650 for the first and second clocks CK1, CK2 are shown in FIG. 8B. A first inverter formed by PMOS transistor M2 and NMOS transistor M3 has an output connected to a negative output 614. The source of PMOS transistor M2 is connected to VDD supply 612. PMOS transistor M1 has a source connected to supply VDD 612 and a drain connected to the negative output 614. The gate of transistor M1 is connected to a clock input 602.

The negative output 614 is connected to the input of a second inverter formed by PMOS transistor M5 and NMOS transistor M7. The second inverter has an output connected to a positive output 616 (DOUT_P). The source of PMOS transistor M5 is connected to VDD supply 612. PMOS transistor M6 has a source connected to supply VDD 612 and a drain connected to the positive output 616. The gate of transistor M6 is connected to a clock input 602. The positive output 616 is connected to the input of the first inverter.

Node 618 is connected to the source of transistor M3 and the drain of NMOS transistor M4. The gate of transistor M4 may be connected to a first input 608 which for a differential implementation may be a positive input (IN_P) and for a single ended implementation may be the input (IN).

Node 620 is connected to the source of transistor M7 and the drain of NMOS transistor M8. The gate of transistor M8 may be connected to a second input 606 which for a differential implementation may be a negative input (IN_N) and for a single ended implementation may be connected to a reference voltage, typically Vdd/2.

Node 622 is connected to the source of transistors M4 and M8 and the drain of NMOS transistor M9. The source of transistor M9 is connected to ground 604. The gate of transistor M9 is connected to the clock input 602.

The positive output 616 is connected to the D-input of flip-flop 624. The Q output of the flip-flop may be connected to a first quantiser output 626. The Q output may be connected to a second quantiser output 628. In some examples a second flip flop may be added having a D-input connected to the negative output 614.

In operation the quantiser 600 is provided with a sampling clock having sampling frequency FS. The first and second inverters are cross coupled and act as a latch 610. When the input clock CK is low transistors M1 and M6 are switched on and transistor M9 is switched off. The outputs 614, 616 are precharged to Vdd. When the input clock is high, for the differential case, if the input to transistor M4, IN_P, is greater than the input to M8, IN_N, then the negative output 614 will be discharged to ground and the positive output 616 will be pulled high as M5 will turn on. The positive output 616 will then be a "logic 1" and the inverse "logic 0" latched on negative output 614. If the input to transistor M4, IN_P, is less than the input to M8 IN_N, then the positive output 616 will be discharged to ground and the negative output 614 will be pulled high as M5 will turn on. The positive output 616 will then be a "logic 0" and the inverse "logic 1" latched on negative output 614. The flip-flop 624 captures the value of the positive output 616 on the rising edge of CK2 which occurs during the evaluation phase (CK1=1) and outputs the positive output value on first quantiser output 626 and the inverse on the second quantiser output 628.

The quantiser 600 can provide a logical inverter function as the output and the inverse of the outputs are available. In these examples a separate inverting circuit may be omitted. Example embodiments describe a sigma delta ADC that may use a single, ultra-low power gain stage such as a gm-C stage with relaxed requirements. A passive filter is followed by a gm-C stage. As the gm stage provides gain, comparator artefacts in the quantiser such as 1/f noise, thermal noise and offset may be reduced. The gm-C stage may have relaxed requirements because the input signal of the gm-C stage may be very small, and therefore linearity requirements for the gm-C stage are limited. In addition, because the passive filter filters the quantization noise in the feedback path, there is only a limited amount of quantization noise at high frequency. For examples using chopping, this may reduce the risk of noise fold back.

In some embodiments a counter can be added to the feedback loop that may reduce the out of band quantization noise further, which in turn may reduce the fold back of high frequency quantization for example due to chopping.

A sigma-delta analog to digital converter (ADC) is described. The sigma delta ADC includes a passive filter with an input coupled to the ADC input and a filter output. A gain stage has an input connected to the filter output. A quantiser has an input connected to the gain stage output and a quantiser output. The passive filter includes a first filter resistor between the filter input and the filter output and a filter capacitor having a filter capacitor first terminal coupled to the filter output. A feedback resistor is coupled between the quantiser output and the filter output and receives a negative of the value of the output to provide negative feedback to the filter output. The gain stage has a gain element connected to the gain stage input and an output connected to the gain stage output. The gain stage has a capacitor and resistor in series. One terminal of the gain stage capacitor is connected to the gain element output.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:
1. A sigma-delta analog to digital converter (ADC) comprising:
   an input;
   an output;
   a passive filter having a filter output, and a filter input coupled to the input;
   a gain stage having a gain stage output, and a gain stage input coupled to the filter output;
   a quantiser having a quantiser input coupled to the gain stage output, and a quantiser output coupled to the output; and a feedback resistor having a feedback resistor first terminal coupled to the filter output, and a feedback resistor second terminal configured to receive a negative of a value of the output; and wherein
the passive filter comprises a first filter resistor coupled between the filter input and the filter output, and a filter capacitor having a filter capacitor second terminal, and a filter capacitor first terminal coupled to the filter output;
the gain stage comprises: a gain element having a gain element input coupled to the gain stage input, and a gain element output coupled to the gain stage output; a first gain stage capacitor having a first gain stage capacitor first terminal coupled to the gain element output; and a first gain stage resistor having a first gain stage resistor first terminal coupled to a first gain stage capacitor second terminal and a first gain stage resistor second terminal; and wherein the gain element comprises one of a transconductance amplifier and a series arrangement of an operational amplifier and a second gain stage resistor.

2. The sigma-delta ADC of claim 1 wherein the gain stage further comprises:
a chopper circuit having a chopper circuit first input coupled to the passive filter output, a chopper circuit second input coupled to ground, a chopper circuit first output coupled to the gain element input, and a chopper circuit second output coupled to a gain element further input; and
a de-chopper circuit having a de-chopper circuit first input coupled to the gain element output, a de-chopper circuit second input coupled to a gain element further output, a de-chopper circuit first output coupled to the quantiser input, and a second de-chopper output coupled to a quantiser further input.

3. The sigma-delta ADC of claim 1 comprising an inverting circuit for providing the negative of a value of the output, the inverting circuit having an inverting circuit input coupled to the output, and an inverting circuit output coupled to the feedback resistor first terminal.

4. The sigma-delta ADC of claim 1 wherein the quantiser comprises a clocked comparator.

5. The sigma-delta ADC of claim 1 further comprising a counter having a counter input coupled to the quantiser output, and a counter output, wherein the counter is configured to vary the counter output dependent on the quantiser output value.

6. The sigma-delta ADC of claim 5 further comprising:
one or more further feedback resistors in parallel with the feedback resistor, each of the one or more further feedback resistors having a first terminal coupled to the passive filter output; and
a plurality of switches arranged in parallel and configured to switchably couple one of a first voltage and a second voltage to a respective one of the feedback resistor second terminal and the one or more further feedback resistor second terminals dependent on the counter output.

7. The sigma-delta ADC of claim 6 further comprising a dynamic element matching circuit, arranged between the counter output and the plurality of switches, and configured to control the plurality of switches dependent on the counter output value.

8. The sigma-delta ADC of claim 5 wherein the passive filter further comprises a second filter resistor, having a second filter resistor first terminal coupled to the filter capacitor second terminal and a second filter resistor second terminal coupled to ground, and wherein the first gain stage resistor second terminal is coupled to ground.

9. The sigma-delta ADC of claim 1 wherein the filter capacitor second terminal and the first gain stage resistor second terminal are coupled to ground.

10. The sigma-delta ADC of claim 1 further comprising:
a further input;
a further output;
wherein the passive filter has a filter further input coupled to the further input, and a filter further output coupled to the filter capacitor second terminal;
the gain stage has a gain stage further output, and a gain stage further input coupled to the filter further output;
the quantiser has a further quantiser input coupled to the gain stage further output, and a quantiser further output coupled to the further output; wherein
the passive filter comprises a second filter resistor having a second filter resistor first terminal coupled to the filter further input and a second filter resistor second terminal coupled to the filter further output;
the gain element has a gain element further input coupled to the gain stage further input, and a gain element further output coupled to the gain stage further output, and the gain stage further comprises a second gain stage capacitor coupled between the gain element further output and the first gain stage resistor second terminal; and
the sigma-delta ADC further comprises a further feedback resistor having a further feedback resistor first terminal coupled to the output and a further feedback resistor first terminal coupled to the passive filter further output; and wherein the feedback resistor first terminal is coupled to the further output and the feedback resistor second terminal is coupled to the passive filter output.

11. The sigma-delta ADC of claim 10 wherein the gain stage further comprises:
a chopper circuit having a chopper circuit first input coupled to the passive filter output, a chopper circuit second input coupled to the filter further output, a chopper circuit output coupled to the gain element input, and a chopper circuit second output coupled to the gain element further input; and
a de-chopper circuit having a de-chopper first input coupled to the gain element output, a de-chopper second input coupled to the gain element further output, a de-chopper first output coupled to the gain stage output, and a de-chopper second output coupled to the gain stage further output.

12. The sigma-delta ADC of claim 10 or 11 wherein the quantiser comprises a clocked comparator.

13. The sigma-delta ADC of claim 10 further comprising a counter having a counter input coupled to the quantiser output, and a counter output, and configured to vary the counter output dependent on the quantiser output value; and
a further counter having a further counter input coupled to the quantiser further output, and a further counter output, and configured to vary the further counter output dependent on the further quantiser output.

14. The sigma-delta ADC of claim 13 further comprising:
one or more first further feedback resistors arranged in parallel with the feedback resistor, each of the feedback resistor and one or more first further feedback resistors having a first terminal coupled to the filter output; and
a plurality of switches configured to switchably couple one of a first voltage and a second voltage to a respective second terminal of the feedback resistor and the one or more first further feedback resistors dependent on the counter output value; and one or more second further feedback resistors arranged in parallel with the further feedback resistor, each of the further feedback resistor and the one or more second further feedback resistors having a first terminal coupled to the filter further output; and a plurality of further switches configured to switchably couple one of the first voltage and the second voltage to a respective second terminal of the further feedback resistor and the one or more second further feedback resistors dependent on the counter output value.

15. The sigma-delta ADC of claim 14 further comprising a dynamic element matching circuit arranged between the counter output and the plurality of switches, and configured to control the plurality of switches dependent on the counter output value.

16. The sigma-delta ADC of claim 13 wherein the passive filter further comprises a second filter resistor having a second filter resistor first terminal connected to the filter capacitor second terminal and a second filter resistor second terminal connected to the filter further output.

17. A differential sigma-delta analog to digital converter (ADC) comprising
a negative signal input and a positive signal input;
a negative signal output and a positive signal output;
a passive filter having a pair of filter inputs and a pair of filter outputs, each filter input coupled to a respective one of the negative signal input and the positive signal input;
a gain stage having a pair of gain stage inputs and a pair of gain stage outputs, the pair of gain stage inputs being coupled to a respective one of the pair of filter outputs;
a quantiser having a pair of quantiser inputs coupled to a respective one of the pair of gain stage outputs and a pair of quantiser outputs coupled to a respective one of the negative signal output and the positive signal output; wherein
the passive filter comprises a filter resistor coupled between each respective filter input and filter output and a filter capacitor coupled between the pair of filter outputs;
the sigma-delta ADC further comprises: a first feedback resistor coupled between the negative signal output and the filter output corresponding to the positive signal input; and a second feedback resistor coupled between the positive signal output and the filter output corresponding to the negative signal input; and
the gain stage comprises a gain element having a pair of gain element inputs coupled to the pair of gain stage inputs and a pair of gain element outputs coupled to the pair of gain stage outputs and a series arrangement of a first gain stage capacitor, a first gain stage resistor, and a second gain stage capacitor coupled between the pair of gain element outputs.

18. The differential sigma-delta ADC of claim 17 wherein the gain stage further comprises:
a chopper circuit having a pair of chopper inputs, each chopper input coupled to a respective one of the pair of gain stage inputs and a pair of chopper outputs each chopper output coupled to a respective one of the pair of gain element inputs; and
a de-chopper circuit having a pair of de-chopper inputs, each de-chopper input coupled to a respective one of the pair of gain element outputs, and a pair of de-chopper outputs, each de-chopper output coupled to a respective one of the pair of gain stage outputs.

19. The differential sigma-delta ADC of claim 17 further comprising:
a first digital integrator having a first digital integrator input coupled to the negative signal output and a first digital integrator output; and
a second digital integrator having a first digital integrator input coupled to the positive signal output and a first digital integrator output.

20. The differential sigma-delta ADC of claim 19 further comprising:
one or more first further feedback resistors in parallel with the first feedback resistor, each of the first feedback resistor and the one or more first further feedback resistors having a first terminal coupled to the filter output corresponding to the positive signal input; and a parallel arrangement of a plurality of switches, each switch configured to switchably couple one of a first voltage and a second voltage to a respective second terminal of the feedback resistor and the one or more first further feedback resistors dependent on the value of the first digital integrator output; and
one or more second further feedback resistors in parallel with the second feedback resistor, each of the further feedback resistor and the one or more second further feedback resistors having a first terminal coupled to the filter output corresponding to the negative signal input; and a plurality of switches, each switch configured to switchably couple one of the first voltage and the second voltage to a respective second terminal of the further feedback resistor and the one or more second further feedback resistors dependent on a value of the second digital integrator output.

* * * * *